(12) United States Patent
Sakaguchi et al.

(10) Patent No.: US 7,897,432 B2
(45) Date of Patent: Mar. 1, 2011

(54) METHOD FOR PRODUCING ELECTRONIC PART PACKAGE

(75) Inventors: Hideaki Sakaguchi, Nagano (JP);
Masahiro Sunohara, Nagano (JP);
Mitsutoshi Higashi, Nagano (JP)

(73) Assignee: Shinko Electric Industries Co., Ltd., Nagano-shi, Nogano (JP)

( * ) Notice: Subject to any disclaimer, the term of this patent is extended or adjusted under 35 U.S.C. 154(b) by 0 days.

(21) Appl. No.: 12/554,091

(22) Filed: Sep. 4, 2009

(65) Prior Publication Data
US 2010/0062564 A1      Mar. 11, 2010

(30) Foreign Application Priority Data
Sep. 5, 2008   (JP) .............................. 2008-228204

(51) Int. Cl.
*H01L 21/44*   (2006.01)
*H01L 21/48*   (2006.01)
*H01L 21/50*   (2006.01)

(52) U.S. Cl. ................ 438/106; 438/108; 257/E21.499

(58) Field of Classification Search ................ 438/100, 438/106, 108, 109, 127; 257/E21.499
See application file for complete search history.

(56) References Cited

U.S. PATENT DOCUMENTS

| 6,586,822 | B1 | 7/2003 | Vu et al. | |
| 6,701,614 | B2 * | 3/2004 | Ding et al. | .................... 29/848 |

* cited by examiner

*Primary Examiner*—Hoai v Pham
(74) *Attorney, Agent, or Firm*—Drinker Biddle & Reath LLP

(57) ABSTRACT

A peeling off layer 18 is formed on an entire surface of one surface side of a support plate 10 including the inner wall surfaces respectively of a recessed part 12 for an electronic part and recessed parts 16 for posts in which the posts 20 are formed. Then, the recessed parts 16 are filled with metal to form the posts 20. Then, conductor patterns 28 are formed that electrically connect the electrode terminals 22a of the electronic part 22 inserted into the recessed part 12 to the posts 20. Then, an insulating layer covering the conductor patterns 28 is formed to form an electronic part package 30 on the one surface side of the support plate 10 through the peeling off layer 18. After that, the electronic part package 30 is separated from the support plate 10 by the peeling off layer 18.

8 Claims, 8 Drawing Sheets

METHOD FOR PRODUCING ELECTRONIC PART PACKAGE

CROSS-REFERENCE TO RELATED APPLICATIONS

This application is based on and claims priority under 35 U.S.C. §119 from Japanese Patent Application No. 2008-228204 filed on Sep. 5, 2009.

BACKGROUND OF THE INVENTION

1. Technical Field

The present invention relates to a method for producing an electronic part package, and more particularly to a method for producing an electronic part package in which electrode terminals of a mounted electronic part are electrically connected to posts as external connecting terminals by electrically conductive patterns.

2. Related Art

An electronic part such as a semiconductor element has been progressively thinned in order to miniaturize a mounting device on which the electronic part is mounted. Accordingly, as for an electronic part package on which the electronic part is mounted, the thin electronic part package has been requested similarly to the electronic part mounted thereon.

To meet such a demand, U.S. Pat. No. 6,586,822 proposes a method for producing an electronic part package having the same thickness as that of mounted electronic part.

The method for producing the electronic part package proposed in U.S. Pat. No. 6,586,822 is shown in FIG. 9. In the method for producing the electronic part package shown in FIG. 9, as shown in FIG. 9(a), a through hole 102 is opened at a prescribed position of a resin plate 100 having the same thickness as that of the mounted electronic part, and then, a resin film 104 is stuck to one surface side of the resin plate 100.

An electronic part 106 is inserted into the through hole 102 having one side of an opening part covered with the resin film 104 in such a way as shown in FIG. 9(b). At this time, the electronic part 106 is inserted so that electrode terminals 106a, 106a, . . . of the electronic part 106 are located in the resin film 104 side.

Gaps 102a between the inserted electronic part 106 and the through hole 102 are filled with a resin 108 as shown in FIG. 9(c) to fix the electronic part 106 in the through hole 102.

Then, conductor patterns 114 are laminated through resin layers 110 by, what is called a build-up method (FIG. 9(f)) in which as shown in FIG. 9(d), on the resin layer 110 that covers en entire surface of one surface side of the resin plate 100 from which the resin film 104 is peeled off, recessed parts 112 are formed in which the electrode terminals 106a of the electronic part 106 are exposed on bottom surfaces, and then, as shown in FIG. 9(e), the conductor patterns 114 is formed that are electrically connected to the electrode terminals 106a exposed on the bottom surfaces of the recessed parts 112.

According to the method for producing the electronic part package shown in FIG. 9, the thin electronic part package having the same thickness as that of the electronic part can be formed.

However, in the electronic part package obtained by the method for producing the electronic part package shown in FIG. 9, the resin plate 100 is left. Therefore, the obtained electronic part package has a small thickness, however, has a large area.

On the other hand, in a mounting device on which the electronic part package is mounted, an area of the electronic part package is also requested to be reduced for the purpose of its miniaturization.

SUMMARY OF THE INVENTION

Thus, it is an object of the present invention to provide a method for producing an electronic part package that can solve a problem of a usual method for producing an electronic part package which can have the same thickness as that of a mounted electronic part, however, has a large area, and can reduce both the thickness and the area.

When the inventors of the present invention studied whether the electronic part package could be produced or not without using the resin plate 100 in the method for producing the electronic part package shown in FIG. 9, they found that since the electronic part 106 is formed to be thin and compact, the strength of the electronic part 106 could not endure a stress acting in a production process of the electronic part package.

Accordingly, the inventors of the present invention finds that the electronic part is supported by a support plate to form the electronic part package and the support plate is finally removed to form the electronic part package including no support plate, and reached the present invention.

That is, according to a first aspect of the invention, there is provided a method for producing an electronic part package in which electrode terminals of the electronic part to be mounted are electrically connected to posts as external connecting terminals by electrically conductive patterns, the method including the steps of:

forming a peeling off layer on an entire surface of one surface side of a support plate with inner wall surfaces having a first recessed part that is opened to the one surface side of the support plate and into which the electronic part are inserted to be positioned and second recessed parts in which the posts are formed, filling the second recessed parts with an electrically conductive material to form the posts, inserting the electronic part into the second recessed part;

forming the electrically conductive patterns that electrically connect the electrode terminals of the electronic part to the posts, forming an insulating layer covering the electrically conductive patterns to form the electronic part package on the one surface side of the support plate through the peeling off layer; and separating the electronic part package from the support plate by the peeling off layer.

According to a second aspect of the invention, there is provided the method for producing an electronic part package of the first aspect, wherein the first recessed part is formed by applying a sandblasting process to the one surface side of the support plate.

In this invention, the recessed part for the electronic part corresponding to the inserted electronic part can be easily formed.

According to a third aspect of the invention, there is provided the method for producing an electronic part package of the first or second aspect, wherein the support plate is made of silicon or glass.

Then, the electronic part can be assuredly supported.

Further, according to a fourth aspect of the invention, there is provided the method for producing an electronic part package of the first aspect, wherein the support plate is made of silicon, and the first recessed part and the second recessed parts are respectively formed by a dry etching process.

Further, according to a fifth aspect of the invention, there is provided a method for producing an electronic part package in which electrode terminals of electronic part to be mounted are electrically connected to posts as external connecting terminals by electrically conductive patterns, the method including the steps of:

forming a first insulating layer having a thickness same as a thickness of the electronic part on a seed layer made of metal and formed on one surface side of a support plate through a peeling off layer, forming, on the first insulating layer, a first recessed part with a size in which the electronic part is inserted to be positioned and the seed layer is exposed on a bottom surface and second recessed parts in which the seed layer is exposed on bottom surfaces and the posts are formed;

filling the second recessed parts with an electrically conductive material to form the posts, inserting the electronic part into the first recessed part, forming the electrically conductive patterns that electrically connect the electrode terminals of the electronic part to the posts;

forming a second insulating layer that covers the electrically conductive patterns to form the electronic part package in the one surface side of the support plate through the peeling off layer, separating the seed layer from the support plate by the peeling off layer; and removing the seed layer and the first insulating layer adhering to the electronic part package.

According to a sixth aspect of the invention, there is provided the method for producing an electronic part package of the fifth aspect, wherein the support plate is made of silicon or glass.

Then, the electric parts can be assuredly supported.

According to a seventh aspect of the invention, there is provided the method for producing an electronic part package of any one of the first to sixth aspects, wherein the support plate separated from the electronic part package is used again as a support plate.

In the present invention, while the electronic part are supported by the support plate, the electronic part package can be produced. Thus, the deformation of the electronic part can be avoided.

Further, since the electronic part package is formed in one surface side of the support plate through the peeling off layer, the support plate can be separated from the electronic part package. Accordingly, the support plate can be separated from the electronic part package more simply and in a shorter time than a case that the support plate is melted and removed by an etching process.

In such a way, since the support plate required in a production process of the electronic part package can be separated from the electronic part package, the obtained electronic part package can be formed to be thin and have a small area.

Further, in the present invention, the recessed part with the size into which the electronic part can be inserted and positioned is formed directly on the support plate or on the first resin layer formed on the support plate. Therefore, the electrode terminals of the electronic part inserted into the recessed part can be accurately positioned and the displacement of the electrode terminals of the conductive patterns connected thereto can be prevented. As a result, a reliability of the obtained electronic part package can be improved.

DETAILED DESCRIPTION OF THE PREFERRED EMBODIMENTS

Figure 1A:
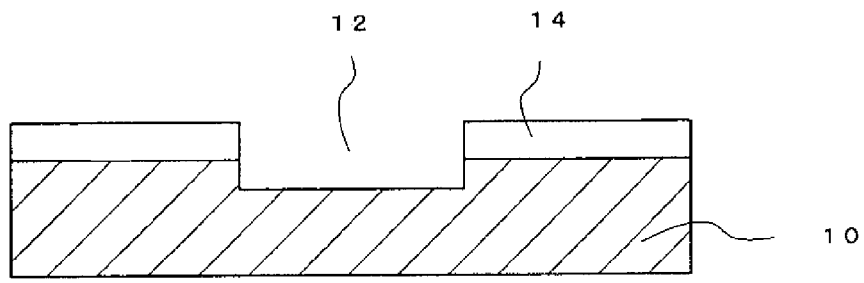
FIGS. 1(*a*) to 1(*c*) are process diagrams that explain a part of processes in one example of a method for producing an electronic part package according to the present invention.
Figure 1B:
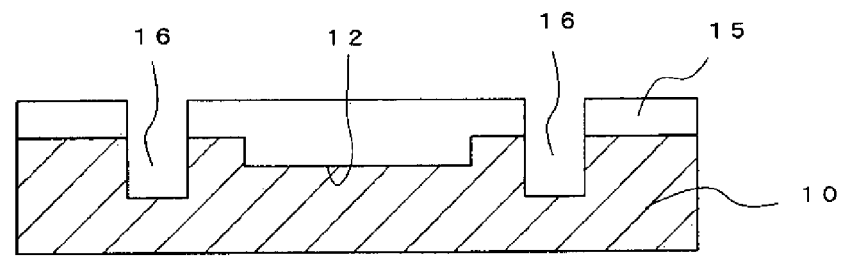

One example of a method for producing an electronic part package according to the present invention is shown in FIGS. 1 to 3. In the method for producing the electronic part package, as shown in FIG. 1(*a*), on one surface side of a support plate 10 made of silicon or glass, a recessed part 12 for an electronic part (refer it to as a recessed part 12, hereinafter) is formed that has a size into which a semiconductor element as the electronic part is inserted and positioned and a thickness equal to the thickness of the inserted semiconductor element. The recessed part 12 is formed by forming an opening part in which the one surface side of the support plate 10 is exposed at a prescribed position of a dry film 14 stuck to the one surface side of the support plate 10, and then applying a sandblasting process. According to the sandblasting process, the recessed part 12 can be accurately formed to meet the form of the inserted semiconductor element.

Further, as shown in FIG. 1(*b*), in peripheral edge sides of the support plate 10 from the recessed part 12, recessed parts 16 and 16 for posts (occasionally refer them as recessed parts 16, hereinafter) are formed whose depth is larger than that of the recessed part 12. The recessed parts 16 are also formed by forming opening parts in which the one surface sides of the support plate 10 are exposed at prescribed positions of a dry film 15 stuck to the one surface side of the support plate 10, and then applying a sandblasting process.

Figure 1C:
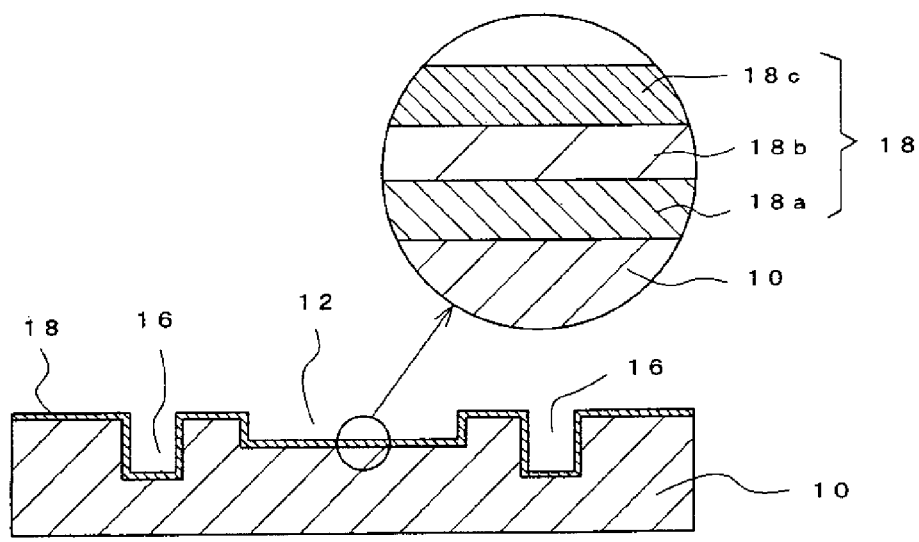

The dry film 15 is peeled off from the one surface side of the support plate 10 including the inner peripheral walls of the recessed part 12 and the recessed parts 16 and 16 to form a peeling off layer 18 on an entire surface of the one surface side of the support plate 10 as shown in FIG. 1(c). The peeling off layer 18 is made of metal and is formed with a layer 18a made of titanium or chromium, a tin layer 18b and a copper layer 18c from the one surface side of the support plate 10 as shown in an enlarged diagram. In the peeling off layer 18, a boundary surface between the layer 18a made of titanium or chromium and the tin layer 18b is liable to be peeled off. The peeling off layer 18 can be obtained by sequentially laminating prescribed metal layers by a sputtering process, a deposition process, an electro-less plating process or an electrolytic plating process.

As the peeling off layer 18, a peeling off layer may be employed in which the copper layer is added between the layer 18a made of titanium or chromium and the tin layer 18b, that is, a peeling off layer may be employed in which the layer made of titanium or chromium, the copper layer, the tin layer and the copper layer are sequentially laminated from the one surface side of the support plate 10.

Figure 2A:
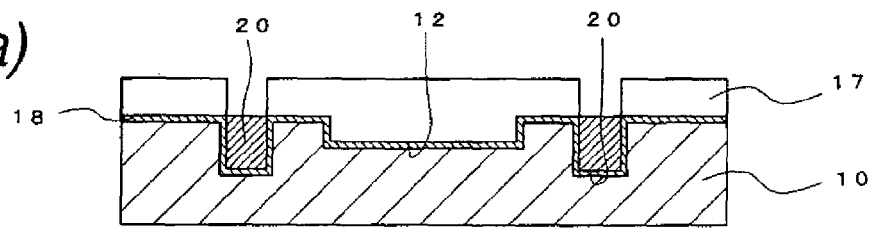
FIGS. 2(*a*) to 2(*f*) are process diagrams that explain processes subsequent to the processes shown in FIGS. 1(*a*) to 1(*c*) in one example of the method for producing an electronic part package according to the present invention.

In the recessed parts 16 and 16 formed in the one surface side of the support plate 10, as shown in FIG. 2(a), parts of a dry film 17 covering the one surface side of the support plate 10 that correspond to the recessed parts 16 and 16 are opened, and then, an electrolytic copper plating process is applied thereto by using the metallic peeling off layer 18 as a feeding layer to fill the recessed parts 16 and 16 with copper and form posts 20 and 20. The shape of the post 20 may be a cone or a pyramid, thereby it is easier to separate the support plate 10.

Figure 2B:
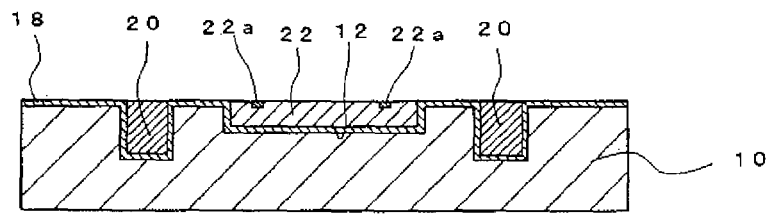

After the dry film 17 is peeled off, as shown in FIG. 2(b), a semiconductor element 22 is inserted into the recessed part 12. The recessed part 12 is formed with such a size as to position the semiconductor element 22 and with a depth equal to the thickness of the semiconductor element 22. Therefore, the semiconductor element 22 inserted into the recessed part 12 can be precisely positioned and its electrode terminals 22a and 22a are also precisely positioned.

Conductor patterns are formed that connect the electrode terminals 22a and 22a respectively to the prescribed posts 20.

Figure 2C:
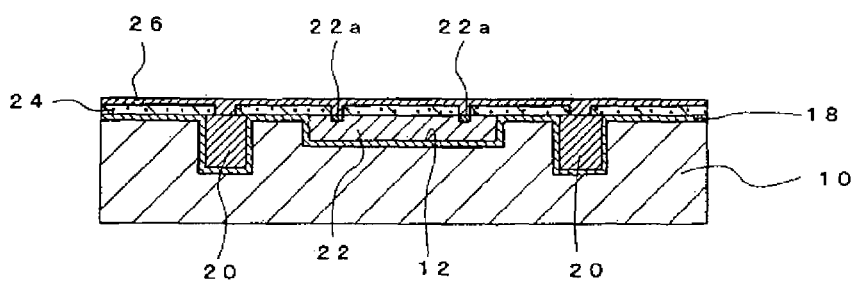

When the conductor patterns are formed, a well-known method such as what is called an additive method or a semi-additive method can be used. In FIG. 2(c), in a resin layer 24 formed so as to cover the one surface side of the support plate 10, are formed recessed parts in which the posts 20 and 20 are respectively exposed on bottom surfaces and recessed parts in which the electrode terminals 22a and 22a of the semiconductor element 22 are exposed on bottom surfaces. After that, a thin metal layer 26 is formed on one surface of the resin layer 24 by an electro-less copper plating process, a deposition process or a sputtering process.

Figure 2D:
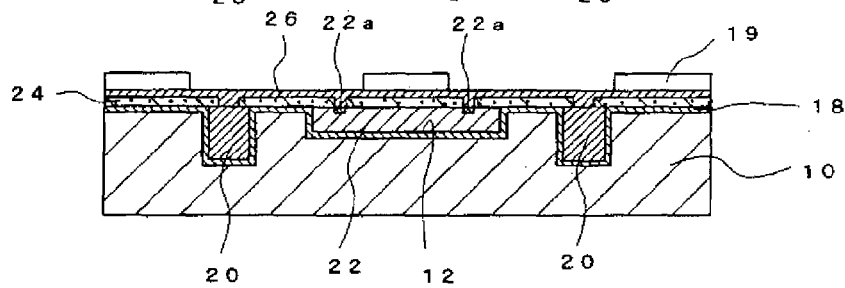
Figure 2E:
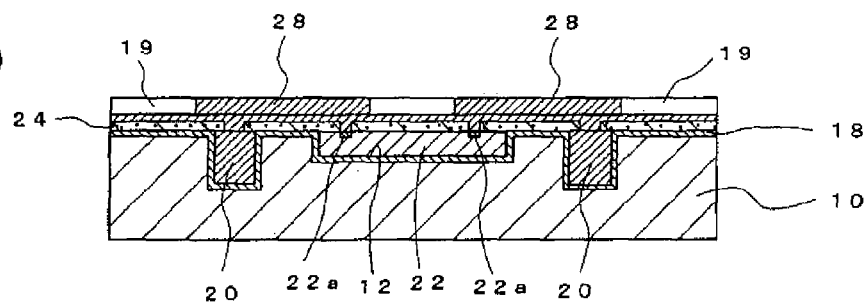

After a patterning process is applied to a dry film 19 stuck to the thin metal layer 26 as shown in FIG. 2(d), an electrolytic copper plating process using the thin metal layer 26 as a feeding layer is applied thereto to form the conductor patterns 28 and 28 as shown in FIG. 2(e).

Figure 2F:
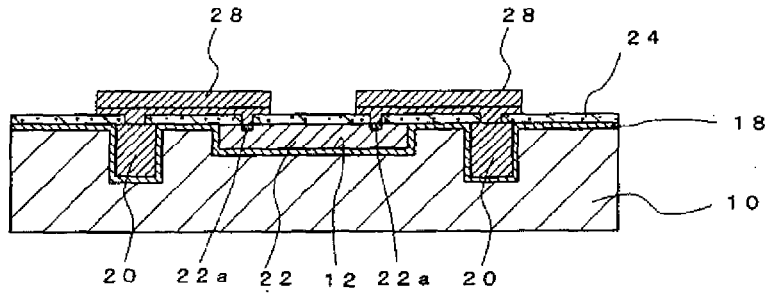

Then, as shown in FIG. 2(f) the dry film 19 is peeled off to remove the exposed thin metal layer 26 by etching and insulate between the conductor patterns 28 and 28.

Figure 3A:
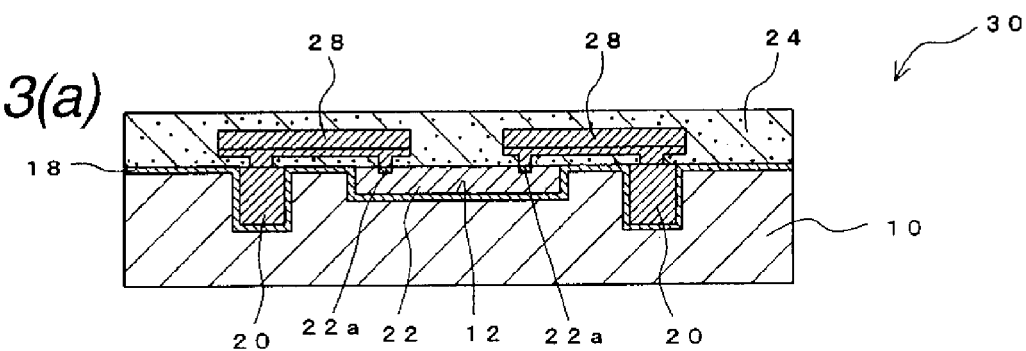
FIGS. 3(*a*) to 3(*c*) are process diagrams that explain remaining processes in one example of the method for producing an electronic part package according to the present invention.

Further, as shown in FIG. 3(a), a part between the formed conductor patterns 28 and 28 is sealed with a resin by the resin layer 24 to form an electronic part package 30.

Figure 3B:
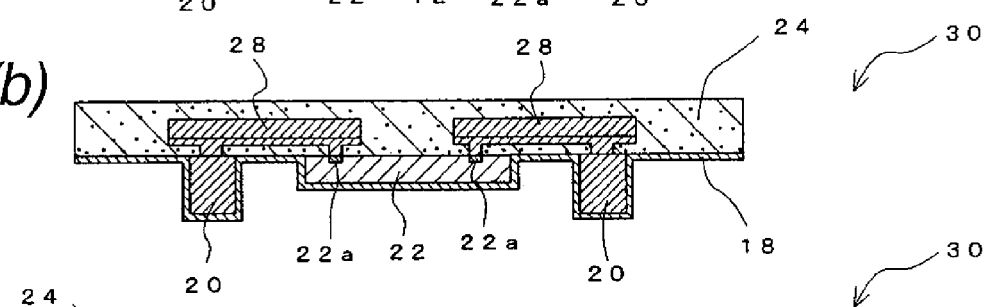

When the electronic part package 30 is separated from the support plate 10 by the peeling off layer 18, a part of the peeling off layer 18 adheres to the electronic part package 30 as shown in FIG. 3(b). Accordingly, the peeling off layer 18 adhering to the electronic part package 30 is removed by etching so that the electronic part package 30 shown in FIG. 3(c) can be obtained.

In the electronic part package 30, the electrode terminals 22a and 22a of the semiconductor element 22 and the posts 20 whose thickness is larger than the thickness of the semiconductor element 22 are respectively electrically connected by the conductor patterns 28 sealed by the resin layer 24.

Figure 3C:
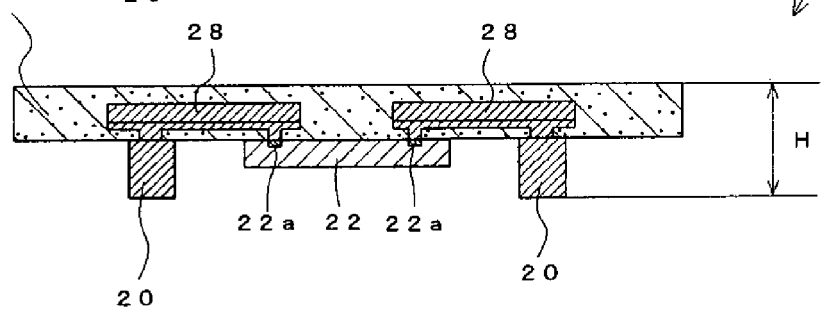

In the electronic part package 30 shown in FIG. 3(c) since the support plate 10 is not left, when the semiconductor element 22 having the thickness of about 20 μm is used as the semiconductor element 22, a thickness H from the upper surface of the resin layer 24 to the lower end of the post 20 can be set to about 100 μm so that an area of the electronic part package 30 can be decreased.

Figure 4A:
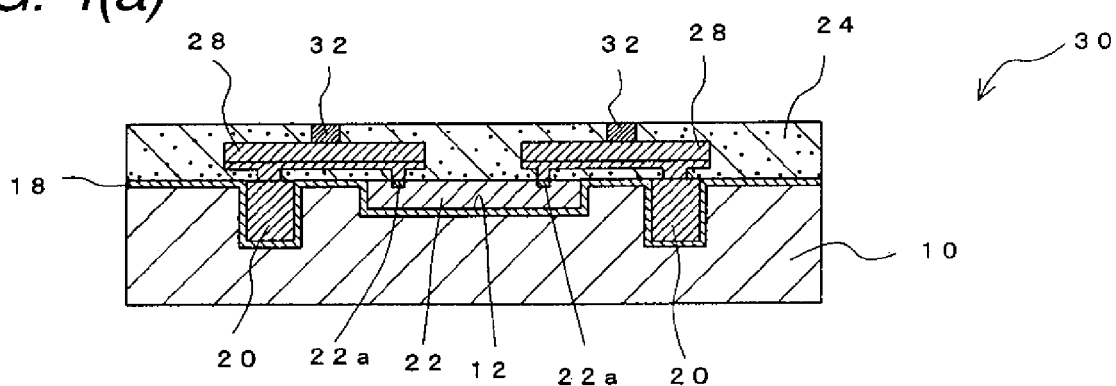
FIGS. 4(*a*) and 4(*b*) are process diagrams that explain another example of a method for producing an electronic part package according to the present invention.
Figure 4B:
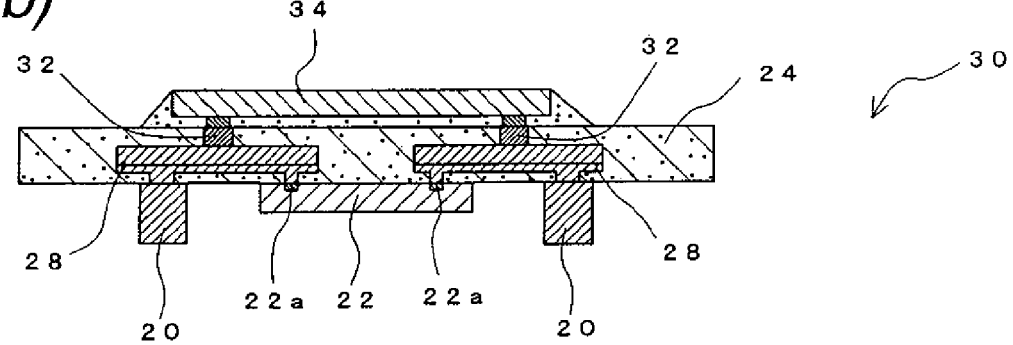

In the electronic part package shown in FIG. 3(c) any parts cannot be provided in an upper surface side. However, in a process shown in FIG. 3(a), via parts 32 are formed with one ends connected to the conductor patterns 28 and the other ends exposed to the upper surface side of the resin layer 24 as shown in FIG. 4(a). Thus, as shown in FIG. 4(b), other electronic part 34 can be mounted on the upper surface side of the electronic part package 30. As other electronic part 34, active parts such as the semiconductor element and passive parts such as a capacitor can be employed.

Since the support plate 10 separated from the electronic part package 30 is formed with silicon or glass, the support plate 10 can be used again as the support plate 10.

In the method for producing the electronic part package shown in FIGS. 1 to 4, the recessed parts 12 and 16 are formed on the support plate 10, however, a producing method is shown in FIGS. 5 to 6 that can obtain an electronic part package without forming the recessed parts 12 and 16 on the support plate 10.

Initially, a seed layer 44 made of metal is formed on one surface side of a support plate 40 made of silicon or glass through a peeling off layer 42. The peeling off layer 42 is a peeling off layer formed with a resin. As the resin, an acrylic resin, a novolak type phenol resin, HMDS (hexamethyl silazane) or the like can be preferably used. Further, the seed layer 44 can be formed by combining together an electro-less plating process, a sputtering process, a electrolytic plating process, a deposition process or the like.

Figure 5A:
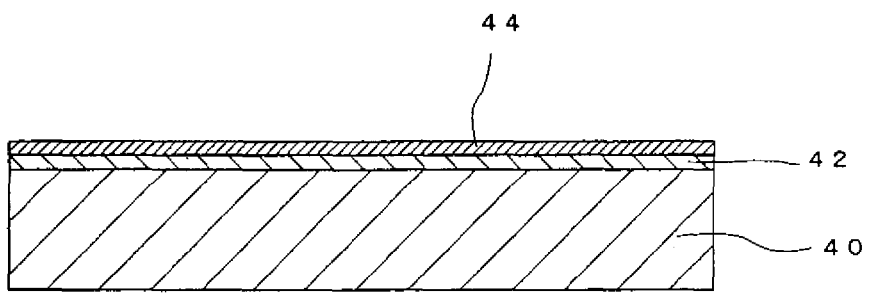
FIGS. 5(*a*) to 5(*d*) are process diagrams that explain a part of processes in other example of a method for producing an electronic part package according to the present invention.
Figure 5B:
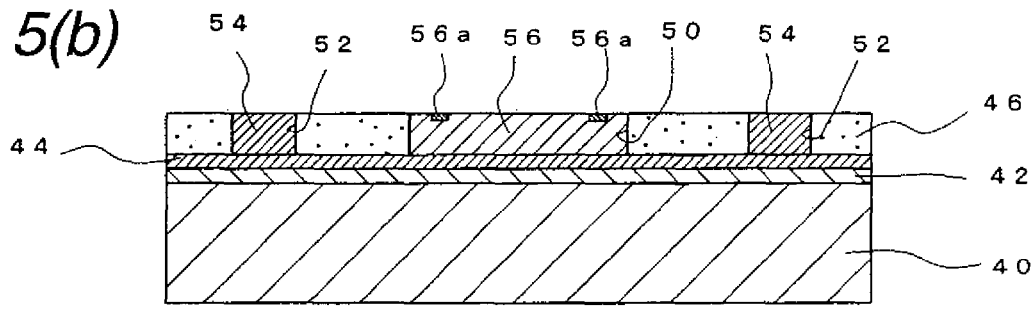

On the seed layer 44, as shown in FIG. 5(b), a first resin layer 46 having the same thickness as that of a semiconductor element as a mounted electronic part is formed, and then, recessed parts 52 for posts (occasionally refer them to as recessed parts 52, hereinafter) are formed in which the seed layer 44 is exposed on bottom surfaces and posts are formed. Further, the recessed parts 52 are filled with copper by an electrolytic copper plating process using the seed layer 44 as a feeding layer to form posts 54.

Then, a recessed part 50 for the electronic part (occasionally refer it to as a recessed part 50, hereinafter) is formed in which the seed layer 44 is exposed on a bottom surface and the semiconductor is inserted. The recessed part 50 has substantially the same area as that of the inserted semiconductor element and has a depth equal to the thickness of the semiconductor element so as to position the inserted semiconductor element. Accordingly, as shown in FIG. 5(b), the semiconductor element 56 inserted into the recessed part 50 can be accurately positioned and its electrode terminals 56a and 56a can be also accurately positioned.

Conductor patterns are formed that connect the electrode terminals 56a and 56a respectively to the prescribed posts 54.

Figure 5C:
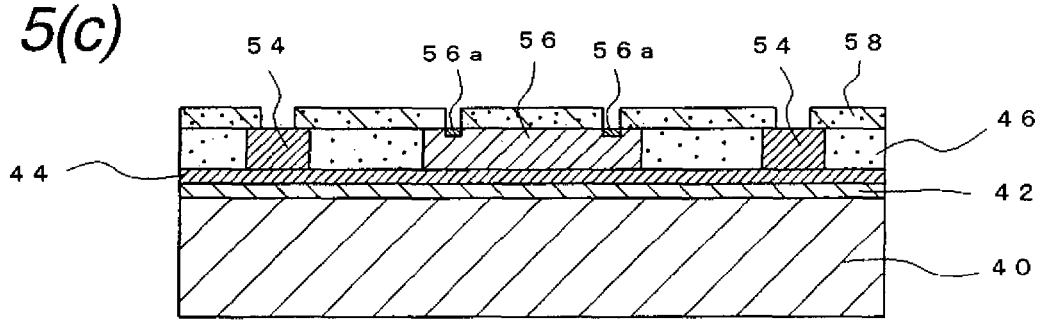
Figure 5D:
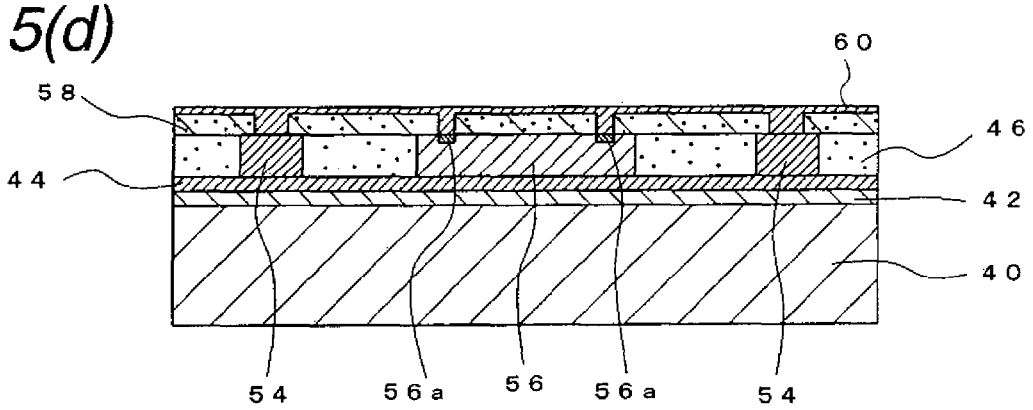

When the conductor patterns are formed, a well-known method such as what is called an additive method or a semi-additive method can be used. In FIG. 5(c), in a second resin layer 58 formed so as to cover the one surface side of the support plate 40, are formed recessed parts in which the posts 54 and 54 are respectively exposed on bottom surfaces and recessed parts in which the electrode terminals 56a and 56a of the semiconductor element 56 are exposed on bottom surfaces. After that, a thin metal layer 60 is formed on one surface of the second resin layer 58 by an electro-less copper plating process, a deposition process or a sputtering process as shown in FIG. 5(d).

Figure 6A:
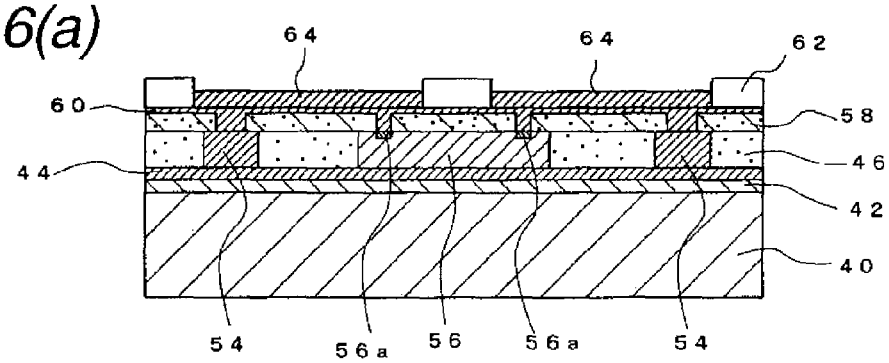
FIGS. 6(*a*) to 6(*e*) are process diagrams that explain remaining processes in other example of the method for producing an electronic part package according to the present invention.

After a patterning process is applied to a dry film 62 stuck to the thin metal layer 60 as shown in FIG. 6(a) an electrolytic copper plating process using the thin metal layer 60 as a feeding layer is applied thereto to form the conductor patterns 64 and 64 as shown in FIG. 6(a).

Figure 6B:
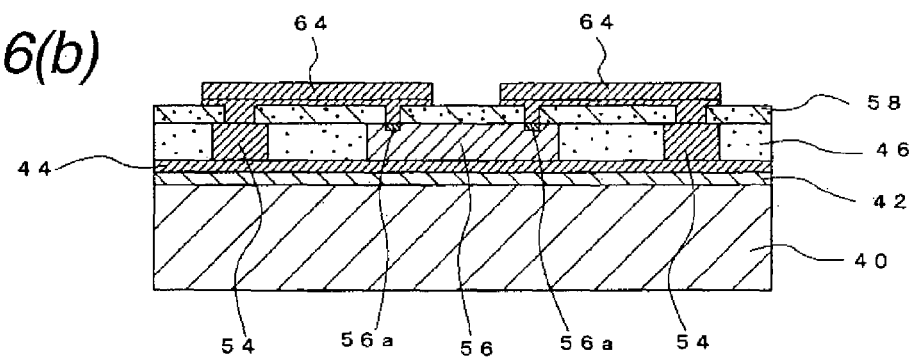

Then, as shown in FIG. 6(b), the dry film 62 is peeled off to remove the exposed thin metal layer 60 by etching and insulate between the conductor patterns 64 and 64.

Figure 6C:
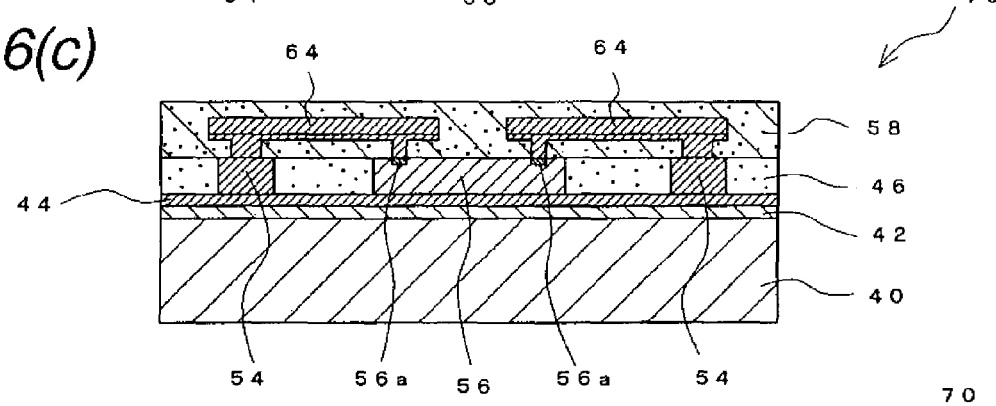

Further, as shown in FIG. 6(c), the formed conductor patterns 64 and 64 are sealed with a resin by the second resin layer 58 to form an electronic part package 70.

Figure 6D:
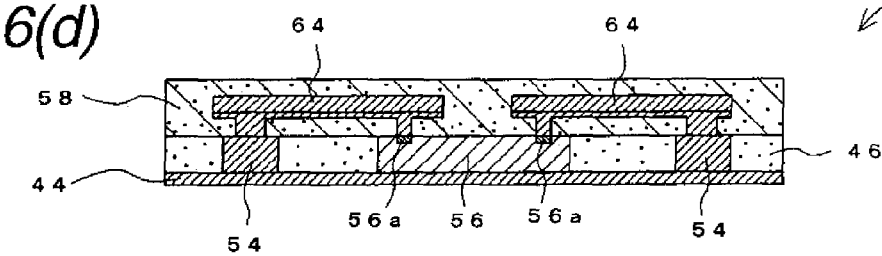

The electronic part package 70 is separated from the support plate 40 as shown in FIG. 6(d). When the electronic part package 70 is separated from the support plate 40, if the peeling off layer 42 is formed with the acrylic resin, the peeling off layer 42 is heated to 180° C. or higher so that the support plate 40 can be separated. If the peeling off layer 42 is formed with the novolak type phenol resin, the support plate 40 can be separated by using a peeling off liquid.

When the electronic part package 70 is separated from the support plate 40, the seed layer 44 adheres to the electronic part package 70 as shown in FIG. 6(d). Accordingly, the seed layer 44 adhering to the electronic part package 70 is removed by etching, and then, the first resin layer 46 is removed so that the electronic part package 70 shown in FIG. 6(e) can be obtained.

In the electronic part package 70, the electrode terminals 56a and 56a of the semiconductor element 56 and the posts 54 whose thickness is equal to the thickness of the semiconductor element 56 are respectively electrically connected by the conductor patterns 64 sealed by the second resin layer 58.

Figure 6E:
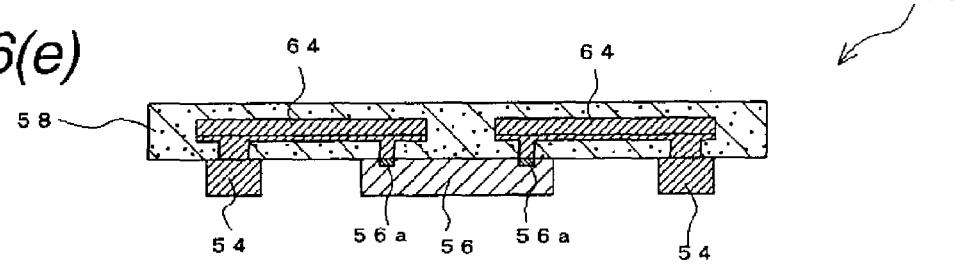
Figure 7:
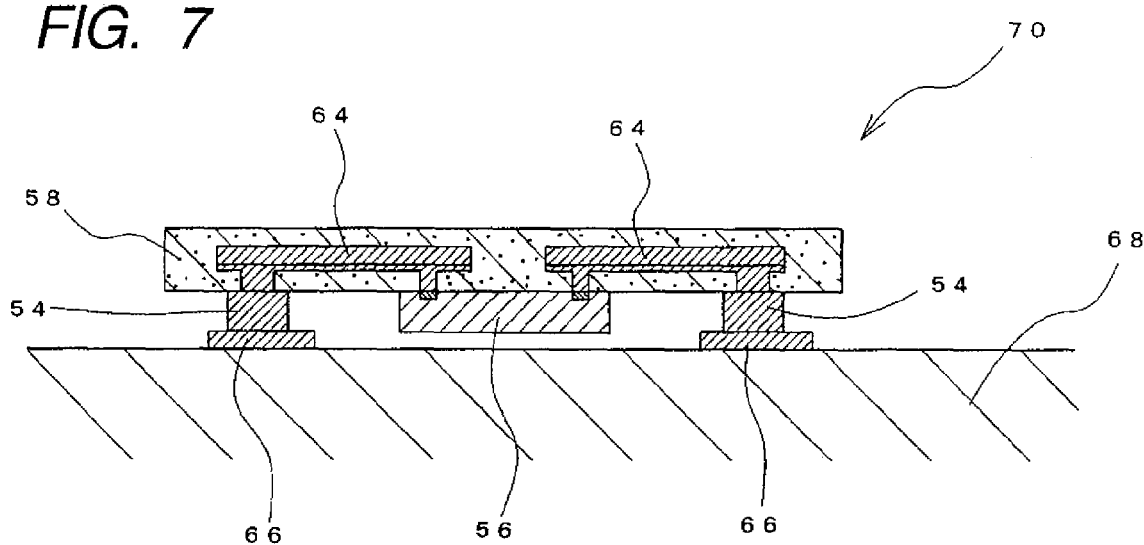
FIG. 7 is an explanatory view explaining a state that the electronic part package obtained by the method for producing an electronic part package shown in FIGS. 5 and 6 is mounted on a mounting substrate.

In the electronic part package 70 shown in FIG. 6(e) since the semiconductor element 56 has the same thickness as that of the posts 54, when the electronic part package is mounted on a mounting substrate, pads 66 and 66 having a prescribed height and connected to the posts 54 and 54 are formed on the mounting substrate 68 as shown in FIG. 7.

Figure 8:
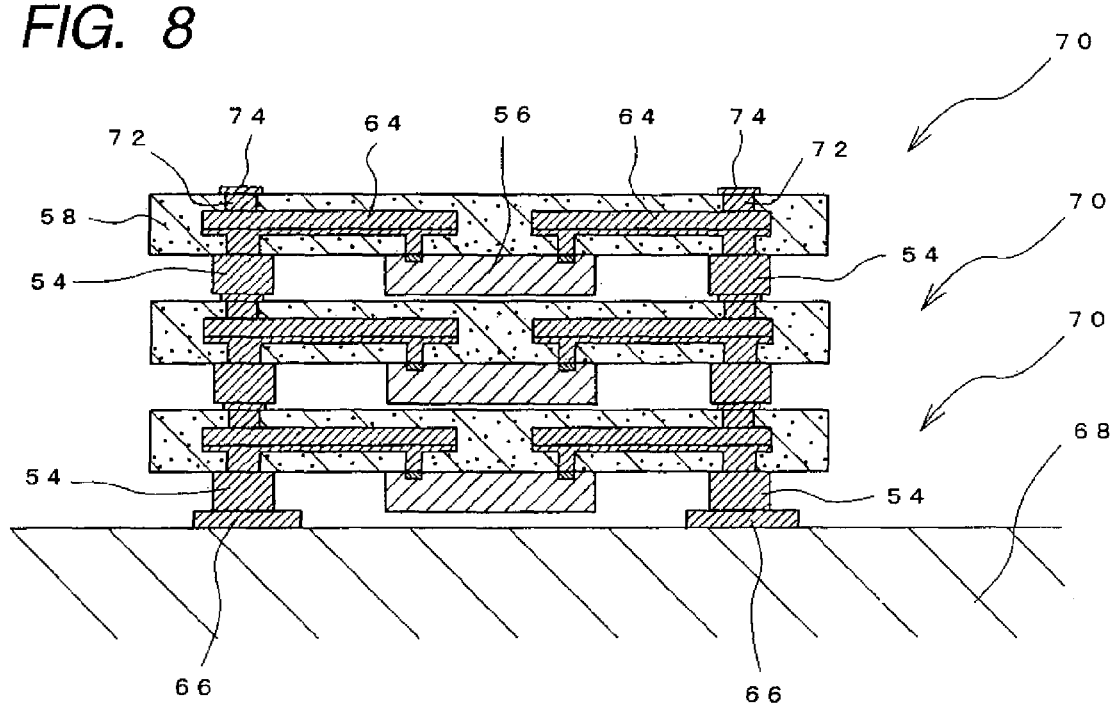
FIG. 8 is an explanatory view explaining a state that a plurality of electronic part packages obtained by other example of the method for producing an electronic part package according to the present invention are laminated.
Figure 9A:
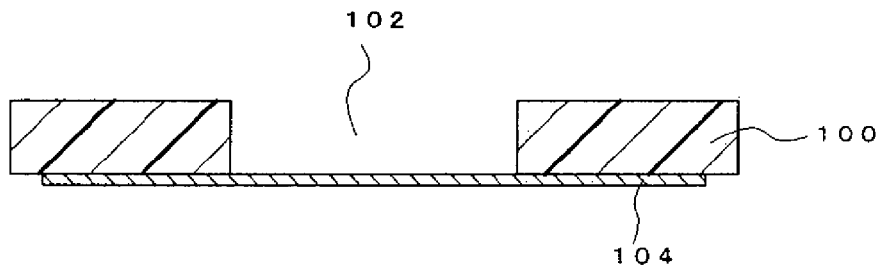
FIGS. 9(*a*) to 9(*f*) are process diagrams that explain processes of a usual method for producing an electronic part package.
Figure 9B:
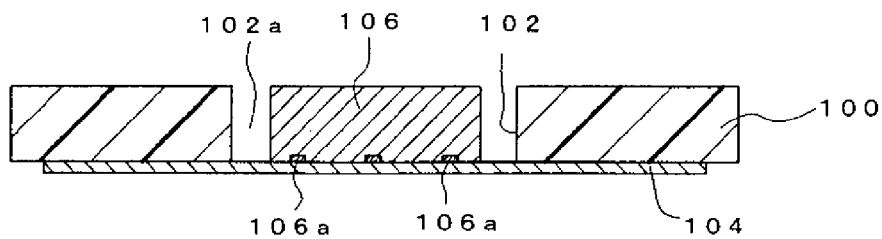
Figure 9C:
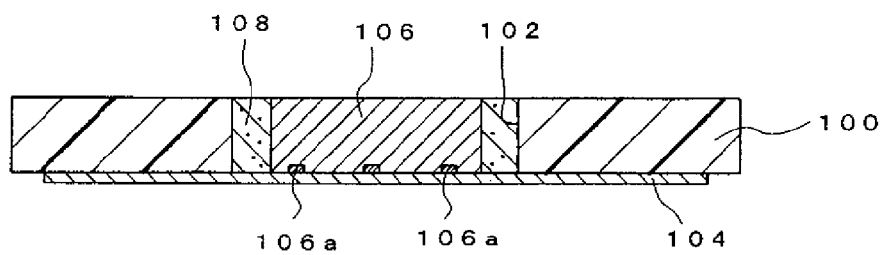
Figure 9D:
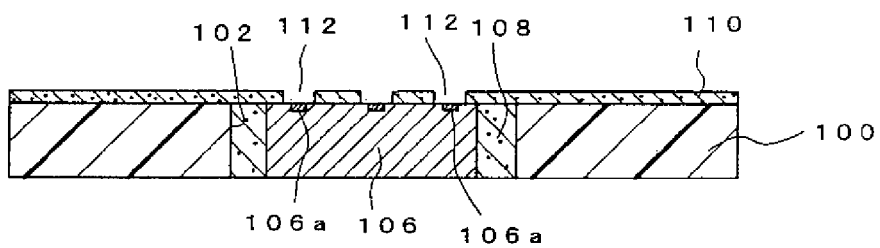
Figure 9E:
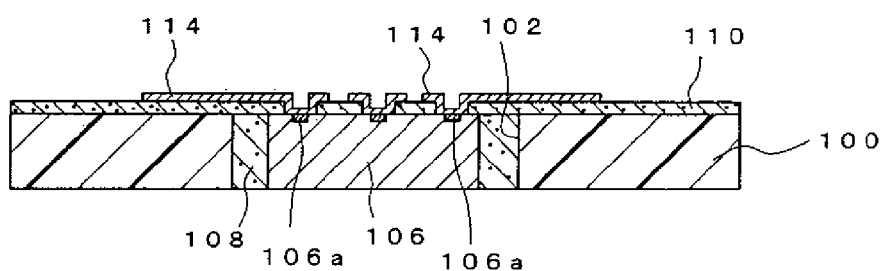
Figure 9F:
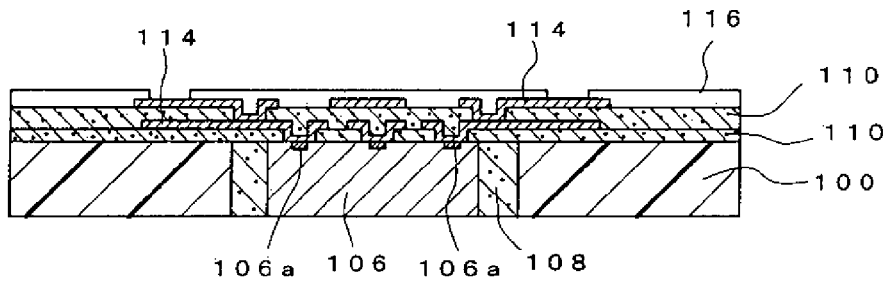

Further, as shown in FIG. 8, a plurality of electronic part packages 70, 70, . . . can be laminated. In this case, on the electronic part packages 70 respectively, pads 74 of a prescribed height are formed on the other end sides of via parts 72 that pass thorough the second resin layers 58 and have one ends connected to the conductor patterns 64.

As the support plate 10 or 40 shown in FIGS. 1 to 6, the support plate made of silicon or glass is used, however, a support plate made of stainless steel, copper, a glass epoxy resin or ceramic may be employed.

Further, when the recessed parts 16, 12, 50 and 52 are formed in the support plates 10 and 40, the recessed parts are formed by a sandblasting process, however, the recessed parts may be formed by a wet etching or a dry etching or a machining work. Especially, the support plate 10 made of silicon is preferably employed as the support plate 10 to form the recessed part 12 for the electronic part and the recessed parts 16 for the posts respectively by the dry etching using $SF_6$ gas or $CF_4$ gas.

Further, a plurality of recessed parts 12 and 50 for electronic parts may be formed on the support plates 10 and 40 to form an electronic part package provided with the plurality of recessed parts into which the plurality of electronic parts are inserted.

The recessed parts 16 and 52 are filled with metal, however, the recessed parts may be filled with an electrically conductive resin.

What is claimed is:

1. A method for producing an electronic part package in which electrode terminals of the electronic part to be mounted are electrically connected to posts as external connecting terminals by electrically conductive patterns, the method comprising the steps of:
forming a peeling off layer on an entire surface of one surface side of a support plate with inner wall surfaces having a first recessed part that is opened to the one surface side of the support plate and into which the electronic part are inserted to be positioned and second recessed parts in which the posts are formed,
filling the second recessed parts with an electrically conductive material to form the posts,
inserting the electronic part into the second recessed part;
forming the electrically conductive patterns that electrically connect the electrode terminals of the electronic part to the posts,
forming an insulating layer covering the electrically conductive patterns to form the electronic part package on the one surface side of the support plate through the peeling off layer; and
separating the electronic part package from the support plate by the peeling off layer.

2. The method for producing an electronic part package of claim 1, wherein
the first recessed part is formed by applying a sandblasting process to the one surface side of the support plate.

3. The method for producing an electronic part package of claim 1, wherein
the support plate is made of silicon or glass.

4. The method for producing an electronic part package of claim 1, wherein
the support plate is made of silicon, and
the first recessed part and the second recessed parts are respectively formed by a dry etching process.

5. The method for producing an electronic part package of claim 1, wherein
the support plate separated from the electronic part package is used again as a support plate.

6. The method for producing an electronic part package of claim 1, further comprising:
a via part formed with one end thereof connected to the conductive patterns and the other end thereof exposed to an upper surface side of the insulating layer.

7. The method for producing an electronic part package of claim 1, wherein
the peeling off layer includes a layer made of titanium or chromium, a tin layer and a copper layer from the one surface side of the support plate.

8. The method for producing an electronic part package of claim 1, wherein
a shape of the post is a cone or a pyramid.

* * * * *